United States Patent
Liu et al.

(10) Patent No.: US 10,164,178 B2
(45) Date of Patent: Dec. 25, 2018

(54) METHODS FOR FORMING NARROW VERTICAL PILLARS AND INTEGRATED CIRCUIT DEVICES HAVING THE SAME

(71) Applicant: Micron Technology, Inc., Boise, ID (US)

(72) Inventors: Jun Liu, Boise, ID (US); Kunal Parekh, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/462,618

(22) Filed: Mar. 17, 2017

(65) Prior Publication Data
US 2017/0256710 A1    Sep. 7, 2017

Related U.S. Application Data

(62) Division of application No. 13/683,418, filed on Nov. 21, 2012, now Pat. No. 9,627,611.

(51) Int. Cl.
*H01L 27/24* (2006.01)
*H01L 45/00* (2006.01)

(52) U.S. Cl.
CPC .......... *H01L 45/06* (2013.01); *H01L 27/2427* (2013.01); *H01L 27/2463* (2013.01); *H01L 45/126* (2013.01); *H01L 45/1233* (2013.01); *H01L 45/143* (2013.01); *H01L 45/144* (2013.01); *H01L 45/148* (2013.01); *H01L 45/1683* (2013.01); *H01L 45/1691* (2013.01)

(58) Field of Classification Search
CPC .......................... H01L 27/2427; H01L 45/1683
See application file for complete search history.

(56) References Cited

U.S. PATENT DOCUMENTS

| 7,420,199 B2 | 9/2008 | Gutsche et al. |
| 7,563,639 B2 | 7/2009 | Shin et al. |

(Continued)

FOREIGN PATENT DOCUMENTS

| KR | 1020060050833 | 5/2006 |
| KR | 1020110015000 | 2/2011 |

(Continued)

OTHER PUBLICATIONS

ISA/KR, International Preliminary Report on Patentability (IPRP), Intl. Appl. No. PCT/US2013/069009, dated May 26, 2015, Korean Patent Office, Republic of Korea, 8 pgs.

(Continued)

*Primary Examiner* — Mounir S Amer
(74) *Attorney, Agent, or Firm* — Holland & Hart LLP

(57) ABSTRACT

In some embodiments, an integrated circuit includes narrow, vertically-extending pillars that fill openings formed in the integrated circuit. In some embodiments, the openings can contain phase change material to form a phase change memory cell. The openings occupied by the pillars can be defined using crossing lines of sacrificial material, e.g., spacers, that are formed on different vertical levels. The lines of material can be formed by deposition processes that allow the formation of very thin lines. Exposed material at the intersection of the lines is selectively removed to form the openings, which have dimensions determined by the widths of the lines. The openings can be filled, for example, with phase change material.

14 Claims, 4 Drawing Sheets

(56) References Cited

U.S. PATENT DOCUMENTS

| | | |
|---|---|---|
| 7,671,354 B2 | 3/2010 | Happ et al. |
| 7,733,685 B2 | 6/2010 | Scheuerlein et al. |
| 8,093,576 B1 | 1/2012 | Lee |
| 8,105,867 B2 | 1/2012 | Matamis et al. |
| 8,133,784 B2 | 3/2012 | Chung et al. |
| 8,148,222 B2 | 4/2012 | Zahurak et al. |
| 8,237,140 B2 | 8/2012 | Lung et al. |
| 8,278,206 B2 | 10/2012 | Oh et al. |
| 8,278,641 B2 | 10/2012 | Lee et al. |
| 8,367,544 B2 | 2/2013 | Cheng et al. |
| 8,377,741 B2 | 2/2013 | Savransky et al. |
| 8,395,935 B2 | 3/2013 | Lung et al. |
| 8,404,514 B2 | 3/2013 | Lee et al. |
| 8,426,840 B2 | 4/2013 | An et al. |
| 8,546,944 B2 | 10/2013 | Min |
| 8,551,853 B2 | 10/2013 | Tsuji et al. |
| 8,581,222 B2 | 11/2013 | Yoo et al. |
| 8,652,909 B2 | 2/2014 | Sills et al. |
| 8,735,862 B2 | 5/2014 | Liu et al. |
| 8,765,581 B2 | 7/2014 | Lee et al. |
| 8,785,213 B2 | 7/2014 | Oh et al. |
| 8,785,237 B2 | 7/2014 | Im et al. |
| 8,883,602 B2 | 11/2014 | Liu et al. |
| 9,018,692 B2 | 4/2015 | Lung |
| 9,252,188 B2 | 2/2016 | Tang et al. |
| 2008/0176374 A1 | 7/2008 | Jon et al. |
| 2008/0280390 A1 | 11/2008 | Kim et al. |
| 2009/0194758 A1* | 8/2009 | Chen ................... G11C 11/5678 257/4 |
| 2009/0280599 A1 | 11/2009 | Im et al. |
| 2011/0018053 A1 | 1/2011 | Lo et al. |

FOREIGN PATENT DOCUMENTS

| | | |
|---|---|---|
| KR | 1020110015337 | 2/2011 |
| WO | WO 2009134678 A2 | 11/2009 |

OTHER PUBLICATIONS

ISA/KR, International Search Report and Written Opinion of the International Searching Authority, Int'l. Appl. No. PCT/US2013/069009, dated Nov. 7, 2013, Korean Patent Office, Republic of Korea, 10 pgs.

ISA/KR, International Search Report and Written Opinion of the International Searching Authority, Int'l. Appl. No. PCT/US2015/022576, dated Jun. 30, 2015, Korean Patent Office, Republic of Korea, 15 pgs.

Taiwan Office Action for ROC (Taiwan) Patent Application No. 102141941, dated May 21, 2015, 14 pgs.

Raoux et al., "Phase-change random access memory: A scalable technology", IBM J. Res & Dev, vol. 52, No. 4/5, pp. 465-479 (Jul./Sep. 2008).

Singapore Search Report and Written Opinion, Appl. No. 11201503611S, dated Oct. 17, 2015, Austrian Parent Office, 21 pgs.

* cited by examiner

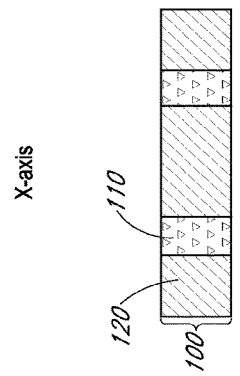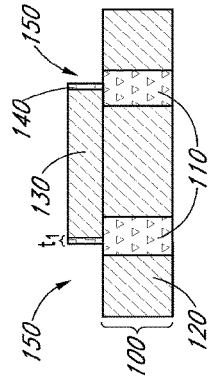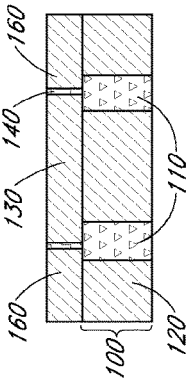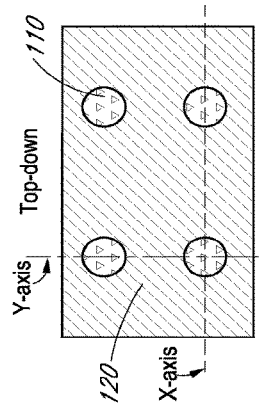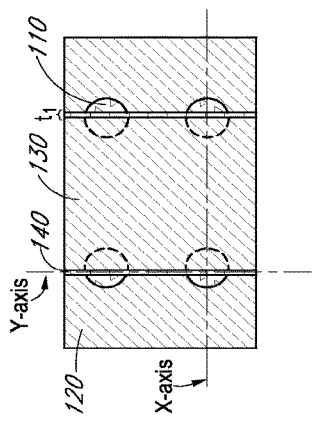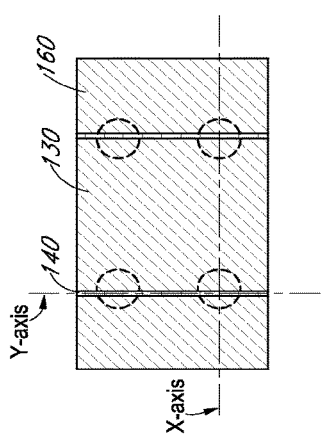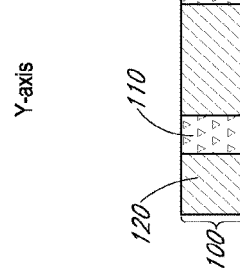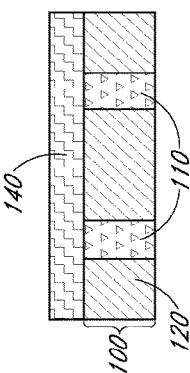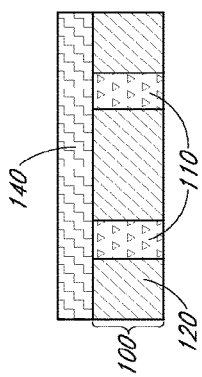
FIG. 1   FIG. 2   FIG. 3

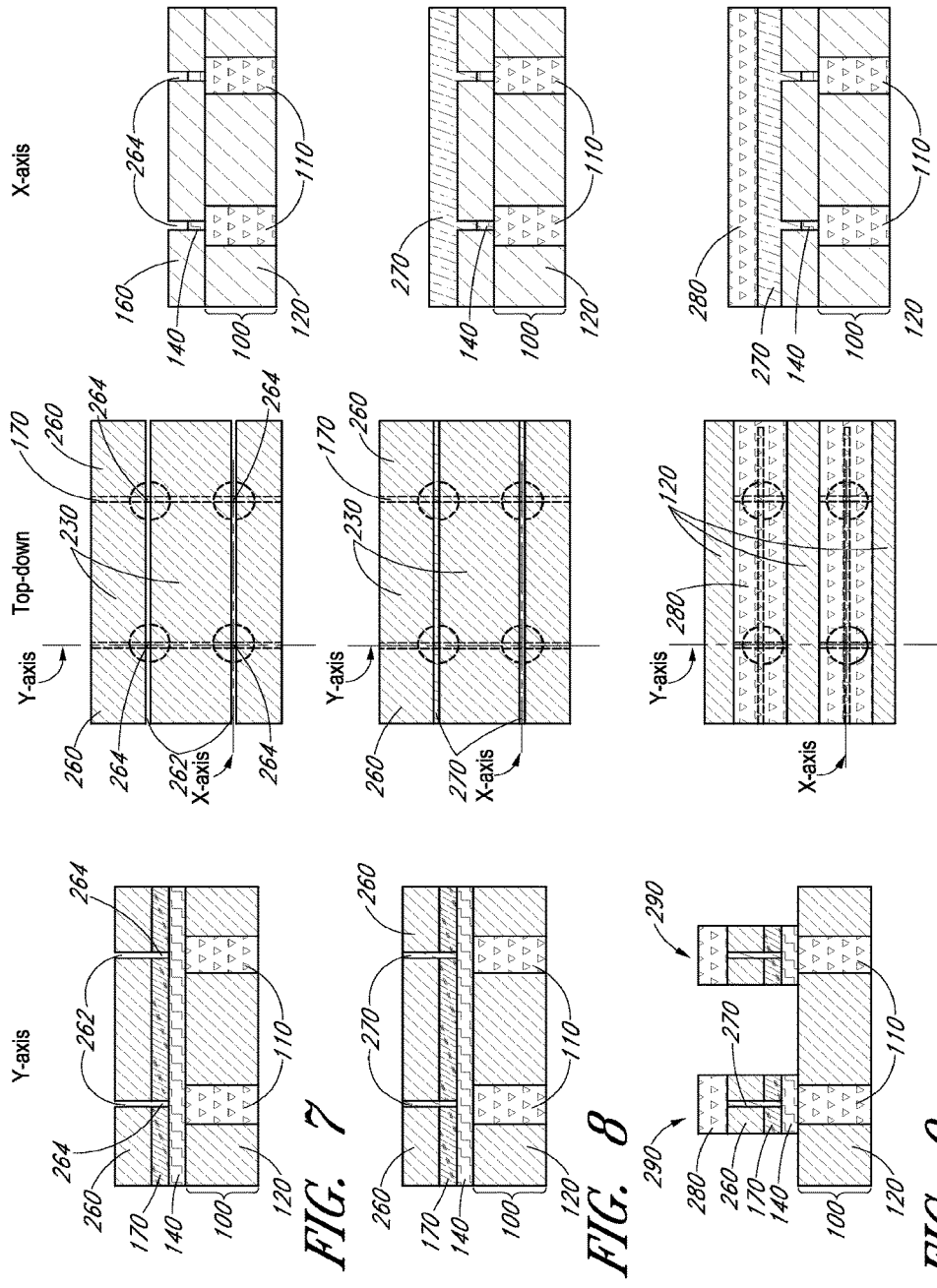

Top-Down of Nanowire Cell

METHODS FOR FORMING NARROW VERTICAL PILLARS AND INTEGRATED CIRCUIT DEVICES HAVING THE SAME

CROSS REFERENCE

The present application for patent is a divisional application of U.S. patent application Ser. No. 13/683,418 by Liu et al., entitled "Methods for Forming Narrow Vertical Pillars and Integrated Circuit Devices Having the Same," filed Nov. 21, 2012, now U.S. Pat. No. 9,627,611, issued Apr. 18, 2017, assigned to the assignee hereof, and expressly incorporated by reference in its entirety herein.

TECHNICAL FIELD

This invention relates generally to integrated circuit fabrication and, more particularly, to processes for forming thin vertical pillars and to the resultant integrated circuit devices, which may include phase change memory cells.

BACKGROUND

As a consequence of many factors, including demand for increased portability, computing power, memory capacity and energy efficiency, the density of electrical features in integrated circuits is continuously increasing. To facilitate this scaling, the sizes of these electrical features are constantly being decreased.

The trend of decreasing feature size is evident, for example, in memory circuits or devices such as read only memory (ROM), random access memory (RAM), flash memory, resistive memory, etc. Examples of resistive memories include phase change memory, programmable conductor memory, and resistive random access memory (RRAM). To take one example, resistive memory devices may include arrays of cells organized in a cross point architecture. In this architecture, the memory cells may include a cell stack having a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of a word line and bit line and may be "selected" via application of appropriate voltages to those lines. Decreasing the sizes of the memory cells may increase cell density and/or memory device performance.

Accordingly, there is a continuing need for methods for providing integrated circuit features having small sizes.

BRIEF DESCRIPTION OF THE DRAWINGS

The invention will be better understood from the Detailed Description of the Preferred Embodiments and from the appended drawings, which are meant to illustrate Micron 2011-and not to limit embodiments of the invention. It will be appreciated that the drawings are not necessarily to scale, nor are features in the same drawing necessarily on the same scale as other features.

FIG. 1 shows schematic, cross-sectional side and top-down views of a partially fabricated integrated circuit.

FIG. 2 shows schematic, cross-sectional side and top-down views of the partially fabricated integrated circuit of FIG. 1 after forming mandrels on a first level and forming spacers along sidewalls of the mandrels.

FIG. 3 shows schematic, cross-sectional side and top-down views of the partially fabricated integrated circuit of FIG. 2 after filling gaps at sides of the spacers.

FIG. 7 shows schematic, cross-sectional side and top-down views of the partially fabricated integrated circuit of FIG. 6 after removing the spacers on the second level thereby forming an open spacer volume on the second level and also removing exposed material in the spacer volume on the first level.

FIG. 8 shows schematic, cross-sectional side and top-down views of the partially fabricated integrated circuit of FIG. 7 after forming, e.g., depositing, material in the open volume on the second level.

FIG. 9 shows schematic, cross-sectional side and top-down views of the partially fabricated integrated circuit of FIG. 8 after defining free-standing stacks.

DETAILED DESCRIPTION

Figures 4, 5, 6:
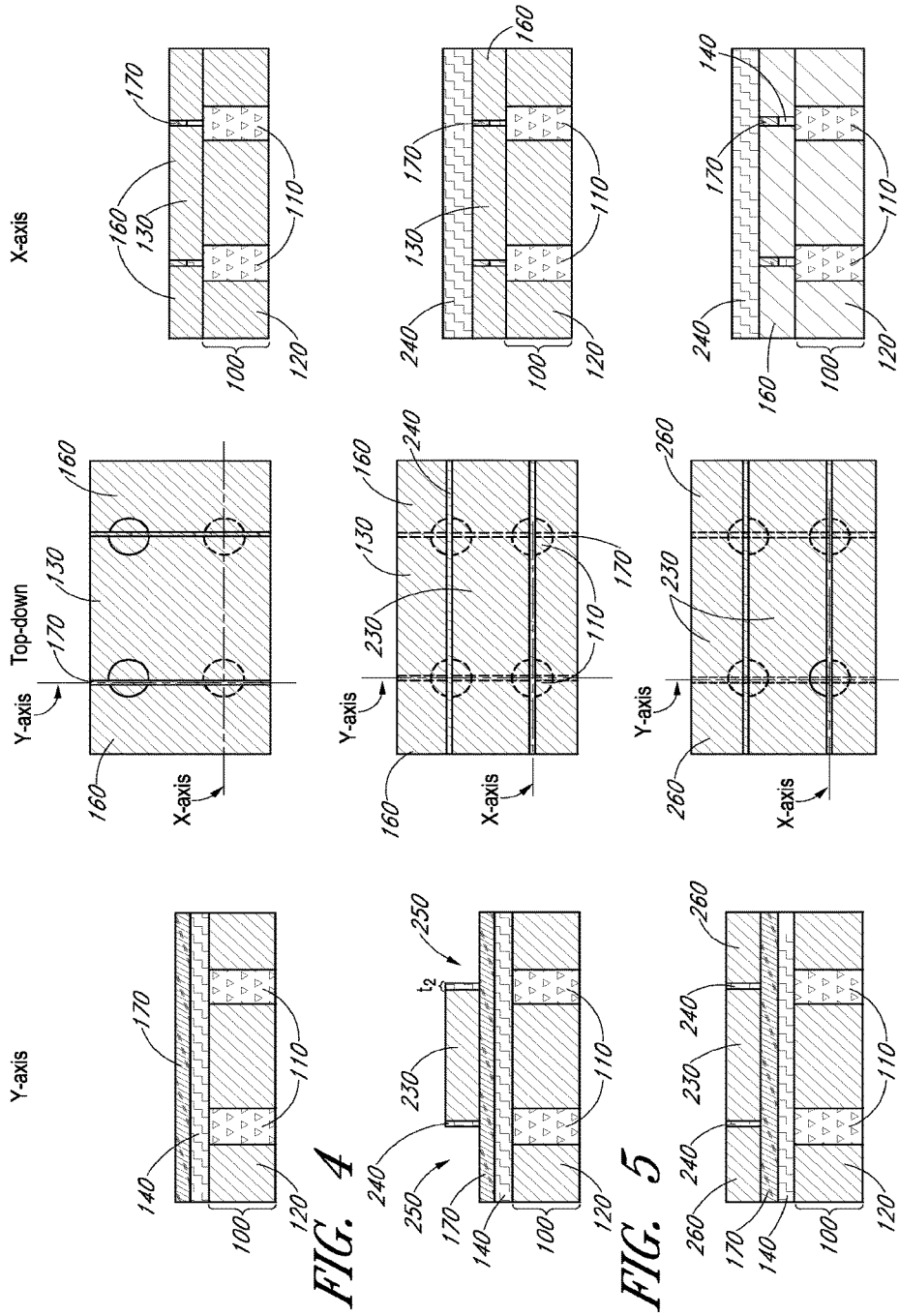
FIG. 4 shows schematic, cross-sectional side and top-down views of the partially fabricated integrated circuit of FIG. 3 after recessing spacers to form an open spacer volume and forming, e.g., depositing, a material in the open spacer volume.
FIG. 5 shows schematic, cross-sectional side and top-down views of the partially fabricated integrated circuit of FIG. 4 after forming mandrels on a second level and forming spacers along sidewalls of the mandrels.
FIG. 6 shows schematic, cross-sectional side and top-down views of the partially fabricated integrated circuit of FIG. 5 after filling gaps at sides of the spacers on the second level.

Embodiments disclosed herein have application to and encompass various types of integrated circuits and related apparatus. For example, while not limited to memory devices, some embodiments may be applied to memory devices, including resistive memories, such as phase change memory. It will be appreciated that phase change memory (PCM) exploits the ability of some materials to assume two or more stable resistance states. For example, memory cells may be formed with phase change materials that may assume stable crystalline and amorphous states, which have different electrical resistivities. In some cases, the crystalline state can have a lower resistivity than the amorphous state. The difference in resistivity can be used to store information; for example, the different resistance states may be used to represent different binary states (e.g., "1" states or "0" states). In some configurations, a phase change memory cell may be stably placed in more than two states, with each state having a different resistitivity, thereby allowing the cell to store more information than a binary state cell.

The state of the phase change memory in a memory cell may be changed by application of an electrical signal to the cell. Without being limited by theory, phase change materials are understood to change state by the application of heat, with different levels of heat causing transitions to different states. Thus, the electrical signal can provide energy to a heating element proximate the phase change material (e.g., a resistive heating wire adjacent the phase change material), thereby causing the heating device to generate heat, which causes the phase change material to change state. It will be appreciated that the quantity of heat that is desired determines the amount of energy supplied to the heater, and that quantity of heat is at least partly determined by the amount of phase change material present in a phase change memory cell.

In some embodiments, an integrated circuit may be formed having narrow, vertically-extending openings filled with material, such as phase change material and/or a heating element. To form these openings, crossing lines of sacrificial material, e.g., spacers, are formed on different vertical levels. The lines on a level may be substantially parallel, while the lines on different levels cross one another. The lines of material can be formed by deposition processes that allow the formation of very thin pillars, e.g., pillars with widths less than the minimum resolution of photolithography processes used to define other features in the integrated circuit. Material at the intersection of the lines is selectively removed to form openings, which have dimensions determined by the widths of the lines and, thus, can have dimensions less than that formed by photolithography. The openings can be filled with material to form a pillar of the material. For example, phase change material and/or a conductive material for forming a heating element can be deposited in the openings. Electrodes can be provided above and below the opening to allow electrical connection to other circuitry (e.g., bit lines and word lines).

As described herein, various embodiments allow the formation of openings or pillars, which may be exceptionally narrow and uniform. These openings or pillars can provide benefits in various applications. For example, they can allow the formation of integrated circuits with exceptionally small features. In some embodiments, the amount of phase change material in a memory cell may be reduced relative to forming the cell with processes such as photolithography. Reducing the amount of phase change material present may decrease the sizes of the memory cell, and the smaller amount of material to be heated may decrease the power requirements of the heater for the memory cell. This can lower overall heat levels in a memory device containing arrays of memory cells, improving reliability and reducing the possibility that heating a particular memory cell may disturb the state of neighboring memory cells. In addition, the ancillary electrical connections and devices used to supply power to the heater can be made smaller and/or denser, and/or allowed to supply lower power levels, which may further facilitate device scaling and/or increase device reliability.

Reference will now be made to the Figures in which like numbers refer to like parts throughout.

FIGS. 1-9 illustrate a process flow for forming an integrated circuit with pillars, according to some embodiments. For all of FIGS. 1-9, the center illustration is a cross-sectional top-down view, the left-most illustration is a view of a cross-section taken along the Y-axis shown in the top-down view, and the right-most illustration is a cross-section taken along the X-axis shown in the top-down view.

With reference to FIG. 1, schematic, cross-sectional side and top-down views of a partially fabricated integrated circuit are shown. The partially fabricated integrated circuit includes a substrate 100, which may have various constituent features. For example, the substrate 100 may include a vertically extending structure 110, which may be formed of conductive material and may be an electrode in some embodiments. Examples of conductive materials include metals, e.g., tungsten, and metal silicides, e.g., a cobalt silicide such as CoSi2. Other electrodes may be formed above the electrode 110 and, consequently, the electrode 110 may be referred to as a lower electrode. The electrode 110 may be surrounded by dielectric material 120. The electrode 110 and dielectric material 120 may be disposed over various other structures (not shown), including, for example, underlying conductive interconnects. The illustrated substrate 100 may be part of a semiconductor wafer.

With reference to FIG. 2, schematic, cross-sectional side and top-down views are shown of the partially fabricated integrated circuit of FIG. 1 after forming mandrels on a first level and forming spacers along sidewalls of the mandrels. It will be appreciated that mandrels 130 may serve as placeholders to set the position of spacers 140. While a plurality of mandrels 130 may be provided across the substrate 100, a single mandrel 130 is shown for ease of illustration and discussion. Mandrel 130 may be formed by forming, e.g., depositing, a layer of mandrel material over the substrate 100 and patterning that layer of mandrel material. The layer of mandrel material may be patterned by various methods, including photolithography. For example, a photoresist layer may be deposited over the layer of mandrel material, a pattern may be formed in the photoresist layer by photolithography, and that pattern may subsequently be transferred to the layer of mandrel material to form the illustrated mandrel 130.

It will be appreciated that the mandrel 130 may be part of the final integrated circuit structure and, as a result, the material forming the mandrels 130 may be chosen by considering the properties desired for the mandrel 130 in that final structure. For example, the mandrel 130 may be a dielectric material to provide electrical isolation of later formed features. Examples of dielectric materials include oxides or nitrides, for example silicon oxide or silicon nitride. In some embodiments, the dielectric material is a silicon oxide.

With continued reference to FIG. 2, spacers 140 having a width t1 may be formed along sidewalls of the mandrels 130. In some embodiments, the spacers 140 may be formed by blanket depositing a layer of spacer material over the mandrels 130 and substrate 100. The layer of spacer material may be deposited by various deposition processes, including vapor deposition processes, such as chemical vapor deposition (CVD) and atomic layer deposition (ALD). The spacer layer may be etched using a directional etch, thereby preferentially removing horizontally extending expanses of material to leave spacers 140 at the sides (e.g, contacting) the mandrel 130. Consequently, in some embodiments, the thickness of the spacer layer determines the width t1 of the spacers 140, with the thickness of the layer being substantially equal to the width t1. In some embodiments, the spacer 140 may function as electrode contacts in the final integrated circuit structure. In some other embodiments, the spacer 140 may be formed of a material that allows it to function as a switch, e.g., an ovonic threshold switch (OTS), in the final integrated circuit structure. Examples of materials for forming the spacers 140 to provide OTS functionality include compounds formed of the following combinations of elements: As—Te—I, TiAsSe$_2$, TiAsTe$_2$, Si—Te—As—Ge, Si—Te—As—Ge—P, Al—As—Te, Al—Ge—As—Te, Te$_{39}$As$_{36}$Si$_{17}$Ge$_7$P, As$_{40}$Te$_{(60-x)}$In$_x$ (where 5<x<16.5), As$_{35}$Te$_{(65-x)}$In$_x$ (where 12.5<21.5), As$_{30}$Te$_{(70-x)}$ (where 12.5<x<21.5), and Ge$_{20}$Te$_{(80-x)}$Pb$_x$ (where 2<x<8).

As noted herein, in some embodiments, ALD may be used to deposit exceptionally thin and uniform layers of spacer material, thereby forming exceptionally narrow spacers. In some embodiments, the spacers 140 can have a width t1 of about 40 nm or less, about 25 nm or less, about 10 nm or less, or about 5 nm or less. In some embodiments, the width t1 may be about 2 nm or less. In some embodiments, the spacer layer can have low non-uniformity. For example, the thickness non-uniformity may be about 5% or less, about 2%, about 1% or less, or about 0.5% or less. Examples of spacer materials include $Al_2O_3$, $HfO_2$, $ZrO_2$, $Ta_2O_5$, $La_2O_3$, $TiO_2$, $V_2O_5$, TiN, ZrN, CrN, TiAlN, AlTiN, Ru, Pd, Ir, Pt, Rh, Co, Cu, Fe, and Ni.

With reference to FIG. 3, cross-sectional side and top-down views are shown of the partially fabricated integrated circuit of FIG. 2 after filling gaps 150 at sides of the spacers 140. It will be appreciated that the features in the cross-sectional views shown in FIG. 3 and in the other figures may be repeated across the substrate 100, such that gaps 150 are defined between the spacers 140 and a neighboring spacer and mandrel (not shown). In some embodiments, the gaps 150 may be filled by forming, e.g., depositing, filler material 160 into the gaps 150. The deposited filler material 160 may overfill the gaps 150, and then be planarized. In some embodiments, planarization may include removing material forming peaks on the upper surface of the partially fabricated integrated circuit, e.g., by performing a chemical mechanical polishing (CMP) process to remove excess filler material 160 and/or other material on the upper surface.

The volume occupied by the spacers 140 between the filler material 160 and the mandrels 130 may be referred to as a spacer volume. The spacers 140 may then be selectively recessed to form an opening, e.g. a trench, in the spacer volume, thereby providing a spacer volume that is partially open.

With reference to FIG. 4, schematic, cross-sectional side and top-down views are shown of the partially fabricated integrated circuit of FIG. 3 after recessing spacers 140 to form an open spacer volume and forming, e.g., depositing, a material 170 in the open spacer volume. It will be appreciated that the open spacer volume may be filled with the material 170, e.g., a dielectric material, which may then be planarized, e.g., by CMP. Examples of dielectric materials include oxides and nitrides, such as silicon oxide or silicon nitride. In some embodiments, the dielectric material is a silicon nitride.

With reference to FIG. 5, schematic, cross-sectional side and top-down views are shown of the partially fabricated integrated circuit of FIG. 4 after forming mandrels 230 on a second level and forming spacers 240 along sidewalls of the mandrels 230. The spacers 240 have a width t2. The mandrels 230 and spacers 240 may be formed by processes and using materials such as those discussed herein with respect to mandrels 130 and spacers 140 (FIG. 2), respectively. For example, the spacers 240 may be formed by blanket depositing a layer of spacer material and then directionally etching that layer to form the spacers 240. The thickness of the layer of spacer material may determine the width t2. In some embodiments, the width t2 may be about 40 nm or less, about 25 nm or less, about 10 nm or less, or about 5 nm or less. As seen in the center top-down view, the spacers 240 may extend along an axis crossing the axis along which the spacers 140 extend and the points of intersection of the crossing axes may be vertically aligned with the underlying electrodes 110. As illustrated, in some embodiments, as seen in a top-down view, the spacers 240 may extend substantially perpendicular to the spacers 140. The spacers 240 may be formed directly over and in contact with the underlying material 170.

After forming the spacers 240, gaps 250 may be present at their sides. It will be appreciated that the features in the cross-sectional views shown in FIG. 5 may be repeated across the substrate 100, such that the gaps 250 are defined between the spacers 240 and a neighboring spacer and mandrel (not shown). In some embodiments, the gaps 250 may be filled by forming, e.g., depositing, filler material 260, which may overfill the gaps 250, and then planarizing the upper surface of the resulting structure. In some embodiments, planarization may include removing material forming peaks on the upper surface, e.g., by performing a chemical mechanical polishing (CMP) process to remove excess filler material and/or other material on the upper surface. FIG. 6 shows schematic, cross-sectional side and top-down views of the partially fabricated integrated circuit of FIG. 5 after filling gaps at sides of the spacers on the second level and planarizing the exposed upper surface.

The spacers 240 may subsequently be selectively removed to form trenches in the volume formerly occupied by the spacers 240 between the mandrels 230 and filler 260. The trenches expose portions of the underlying material 170 (FIG. 4) filling the spacer volume in the first level. This exposed material 170 may be selectively removed. FIG. 7 shows schematic, cross-sectional side and top-down views of the partially fabricated integrated circuit of FIG. 6 after removing the spacers 240 on the second level and removing exposed material 170 in the spacer volume on the first level, thereby forming an opening 262 (e.g., trench) on the second level, which extends downwards to form an open volume on the first level. That open volume may then be filled with material and the corresponding filled volume may be referred to as the volume 264, which may take the form of a vertically elongated volume or channel. The spacers 240 (FIG. 6) and exposed material 170 may be removed by exposure to one or more etches. In some embodiments, a wet etch may be used to selectively remove the spacers 240 and a directional etch may be used to selectively remove exposed material 170. In some other embodiments, a single directional etch may be used to remove the spacers 240 and exposed material 170, depending upon whether the single directional etch provides sufficient selectivity for etching both those features. As shown in FIG. 7's top-down view, the narrow volume 264 may be defined at the intersection of the spacers 240 (FIG. 6) and exposed material 170.

In some embodiments, the etch processes use to form the volume 264 can provide a volume with more uniform sidewalls than those formed by photolithography. For example, the edge roughness of the sidewalls may be less than 3 nm, less than about 2 nm, or less than about 1 nm.

FIG. 8 shows schematic, cross-sectional side and top-down views of the partially fabricated integrated circuit of FIG. 7 after forming, e.g., depositing, material 270 in the open volume 262 (FIG. 7) on the second level. As illustrated, the material 270 may also extend into the narrow volume 264 (FIG. 7) on the first level. In some embodiments, the material 270 may be a material which provides a desired electrical functionality in the narrow volume 264. In some embodiments, the material 270 is a material that may exist stably in one or more states. For example, the material 270 may be a phase change material. Examples of phase change materials include chalcogenide materials, such as those formed from germanium (Ge), antimony (Sb), and tellurium (Te), and various combinations thereof. Examples of materials include binary compounds with one or more of these elements (e.g., GeTe, Ge—Sb, In—Se, Sb—Te, Ge—Sb, Ga—Sb, In—Sb, As—Te, and Al—Te); ternary compounds with one or more of these elements (e.g., Ge—Sb—Te, Te—Ge—As, In—Sb—Te, Te—Sn—Se, Ge—Se—Ga, Bi—Se—Sb, Ga—Se—Te, Sn—Sb—Te, and In—Sb—Ge); and quaternary compounds with one or more of these elements (e.g., Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—

In—Sb—Te, Ge—Sb—Se—Te, Ge—Sn—Sb—Te, Ge—Te—Sn—Ni, Ge—Te—Sn—Pd, and Ge—Te—Sn—Pt). It will be appreciated that the ratios of the various elements are not listed in the examples above and may be varied to achieve phase change behavior with multiple stable states. An example of a phase change material is $Ge_2Sb_2Te_5$. In some embodiments, the phase change material 270 is deposited such that it overflows the volume 264 and excess material may be removed, e.g., by CMP, so that it stays substantially completely within the volume 264.

With reference to FIG. 9, an upper electrode 280 may be formed on a third level over the material 270 and the resulting structure may be masked to define free-standing, spaced-apart stacks 290; FIG. 9 shows schematic, cross-sectional side and top-down views of the partially fabricated integrated circuit of FIG. 8 after defining the free-standing stacks 290. The upper electrode 280 may be formed by blanket depositing a layer of conductive material. A mask may then be formed over the resulting structure and the mask may be patterned (e.g., by photolithography) to form a pattern corresponding the free-standing stacks 290. The layers of material that make up the free-standing stacks 290 are subsequently subjected to one or more directional etches selective for those materials, thereby defining the free-standing stacks 290. As illustrated, the conductive material 270 and 140 take the form of plates after the free-standing stacks 290 are formed. As also illustrated, these plates may be elongated along crossing axes.

In some embodiments, a dielectric material may be deposited between the stacks 290 to electrically isolate those stacks from one another. In some embodiments, the dielectric material between the stacks 290 is the same material as the dielectric material 170. In some other embodiments, the dielectric material between the stacks 290 is different from the dielectric material 170.

Figure 10:
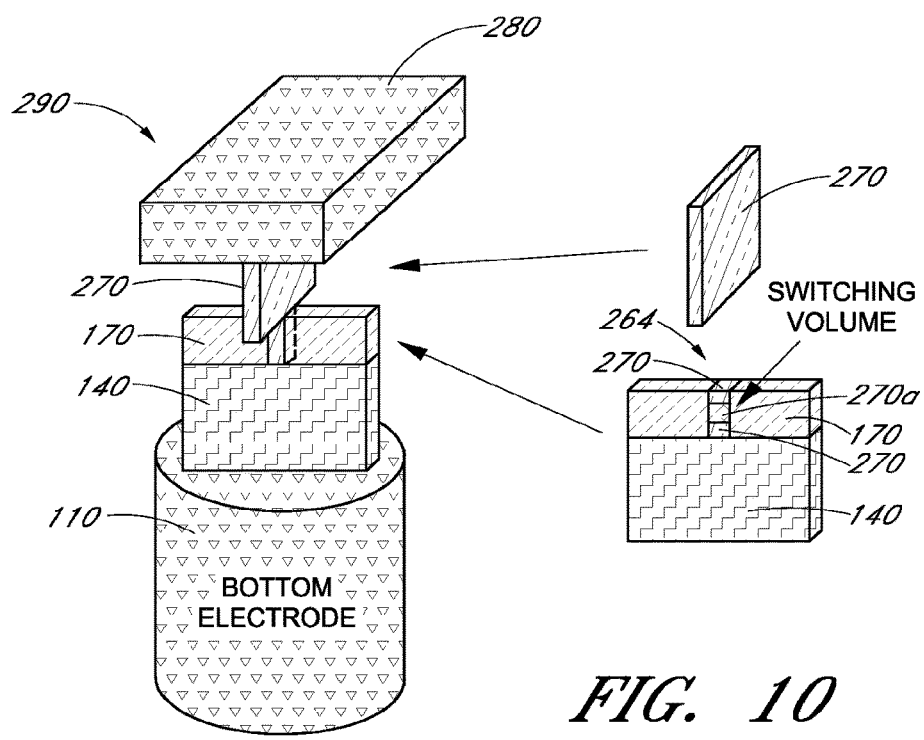
FIG. 10 shows a schematic, perspective view of a memory cell.

It will be appreciated that each of the free-standing stacks 290 may constitute a memory cell 290. FIG. 10 shows a schematic, perspective view of the memory cell 290. The memory cell 290 may be a phase change memory cell in which the material 270 is a phase change material. One of the top or bottom electrodes 280, 110 may provide current to the cell 290, while the other electrode 280, 110 provides a drain. The phase change material 270 and spacer 140 on the second and first levels, respectively, provide electrical contacts to the top and bottom electrodes 280, 110, respectively. Current passing through the material 270 in the relatively small volume 264 can cause resistive or joule heating, which may heat and change the state of portion 270a of the phase change material 270 in the narrow volume 264. As noted herein, the state may be selected based upon the amount of energy (and resulting heat) applied to the material in the volume 264. It will be appreciated that, in some embodiments, other materials, e.g., adhesion layers, may be disposed between various materials in the stack 290, e.g., between the phase change material 270 and the top electrode 280.

In some other embodiments, a separate heater may be used to heat the phase change material 270. For example, the spacers 140 may be formed of a material with electrical resistivity sufficient to heat and to change the state of the phase change material 270. Examples of materials for such a heater include W, Ni, Pt, TiN, TiW, TaN, TaSiN, TiSiN, and NbN. These materials may be originally-deposited during formation of the spacers 140, or may be deposited into the spacer volume after removing the originally-formed spacers.

Figure 11:
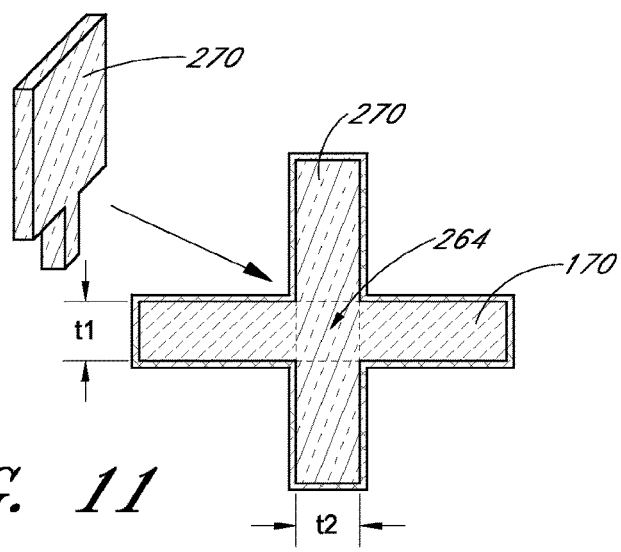
FIG. 11 shows a cross-sectional top-down view the memory cell of FIG. 10.

FIG. 11 shows a cross-sectional top-down view the memory cell of FIG. 10. As noted herein, the narrow volume 264 is defined at the intersection of the spacers 140 and 240, which each define a spacer volume into which other materials 170, 270 may be deposited. Thus, those other materials may then serve to set the dimensions of the openings 264. For example, as illustrated in FIG. 11, the widths of the narrow volume 264 are defined by the intersection of the material 170 (e.g., a dielectric material) filling the spacer volume on the first level, and the material 270 (e.g., a phase change material) filling the spacer volume on the second level. Consequently, the cross-sectional dimensions of the volume 264 may be equal to the widths t1 and t2 of the spacer volumes on the first and second levels, respectively. Thus, the volume 264 and the material within it may extend substantially the entire width of the spacer volumes. For example, the volume 264 may extend the entire width of the laterally elongated region formed by the dielectric material 170. In some embodiments, as seen in a top-down view, the resulting volume 264 may substantially be in the shape of a parallelogram, including, for example, a rhomboid shape, examples of which include a rectangular or square shape. It will be appreciated that the corners of the shape may be rounded, e.g., because etches used in pattern formation may form rounded corners, while the general orientation of the sidewalls to one another may correspond substantially to the shape of a parallelogram and thus be said to be substantially to the shape of a parallelogram.

The memory cell 290 may form part of various devices utilizing memory. For example, the memory cell 290 may be used in personal computers, portable memory sticks, solid state drives (SSDs), digital cameras, cellular telephones, portable music players, movie players, and other electronic devices.

It will be appreciated that various processes and/or structures described herein may be omitted, repeated, combined with other processes or other altered. In some embodiments, one or both of the electrical contacts 140, 270 (FIG. 10) may be omitted. This may be accomplished, for example, by removing all material above the level of the volume 264 after filling that volume. For example, phase change material 270 and other material above the top of the volume 264 may be removed by CMP after forming the structure of FIG. 8. The lower electrical contact 140 may be omitted by completely removing the spacer 140 after forming the structure of FIG. 3.

In some other embodiments, the processing involved with forming the particular structures of FIG. 4 may be omitted. For example, after forming the structure of FIG. 3, spacers 240 (FIG. 5) may be formed directly over that illustrated structure and the volume 264 may be formed by removing the spacer 240 and the part of the spacer 140 exposed by the removal of the spacer 240. Material (e.g., phase change material) may then be deposited into the resulting open volume.

It will be appreciated that where conductive material fills the narrow openings 264, the filler in the opening may be referred to as a conductive line or wire. While discussed with reference to phase change memories and materials, the openings 264 may be filled with other materials. For example, other conductive materials may fill the openings 264 to form electrical fuses, resistive switching memory (e.g., RRAM), or other structures benefitting from thin wire structures.

It will be understood that the invention can take the form of various embodiments, some of which are discussed above and below.

In some embodiments, a method of forming an integrated circuit includes forming a first level mandrel on a first level over a substrate. A first set of spacers is formed along sidewalls of the first level mandrel. A first level filler material is deposited at sides of spacers of the first set of spacers, the first level filler material and the first level mandrels defining a first level spacer volume therebetween. A second level mandrel on a second level is formed above the first level mandrel and the first level spacer volume, the second level mandrel crossing a width of the first level mandrel. A second set of spacers is formed along sidewalls of the second level mandrel. A second level filler material is deposited at sides of spacers of the second set of spacers. The second set of spacers is selectively removed to expose portions of the first level spacer volume. The exposed material in the first level spacer volume is selectively removed to form openings on the first level. The openings are filled and an upper electrode is formed on a third level over the second level, the upper electrode extending directly over one or more of the filled openings on the first level.

In some embodiments, filling the opening comprises forming a phase change material in the opening. Selectively removing the second set of spacers may define trenches between the second level mandrels and the second level filler material, wherein filling the openings also fills the trenches with phase change material. The method may further comprise removing the phase change material outside of the openings before forming the top electrode. The top electrode may electrically contact the phase change material filling the trenches and phase change material forms a part of a phase change memory cell. The method may further comprise providing a bottom electrode underlying the first set of spacers, wherein the first set of spacers are formed of a conductor and electrically interconnect the phase change material in the openings to the bottom electrodes.

In some embodiments, the method may further comprise recessing spacers of the first set of spacers after forming the first level filler material and before forming the second level mandrel, thereby defining trenches in the first level spacer volume; and forming a dielectric material in the trenches, wherein selectively removing the exposed material removes portions of the dielectric material.

In some embodiments, forming the first set or second set of spacers comprises: blanket depositing a layer of spacer material on the first or the second level mandrel; and subjecting the layer of spacer material to a directional etch to define the first or second set of spacers.

In some other embodiments, a method for forming an integrated circuit includes providing a first set of spaced-apart lines of sacrificial material separated by dielectric material. A second set of spaced-apart lines of sacrificial material separated by dielectric material is provided, the second set of spaced-apart lines crossing and contacting tops of lines of the first set of spaced apart lines. The second set of spaced-apart lines and the portions of the first set of spaced-apart lines at the intersection of the first and second sets of spaced apart lines are selectively removed. An electrode is formed over a remainder of the first set of spaced apart lines.

In some embodiments, the integrated circuit is a phase change memory and selectively removing the second set of spaced-apart lines and the portions of the first set of spaced-apart lines may define openings at the intersection of the first and second sets of spaced apart lines, and the method further comprises: filling the openings with a phase change material. The method may further comprise, after filling the openings, etching material around the opening to define free-standing memory cell stacks separated by open space, wherein each stack comprises an opening filled with the phase change material. The method may further comprise, depositing dielectric material in the space separating the stacks. The dielectric material in the space separating the stacks may be different from dielectric material separating the first set of spaced-apart lines of sacrificial material.

In yet other embodiments, an integrated circuit includes a memory cell. The memory cell includes a bottom electrode; an upper electrode; and a conductive line in a channel extending vertically between the bottom and upper electrodes. The conductive line has a cross-section substantially in the shape of a parallelogram as seen in a top down view. Each side of the parallelogram may have a length of about 40 nm or less.

In some embodiments, a width of the conductive line, as seen from a top down view, is defined by a width of a spacer volume. The length may be about 25 nm or less in some embodiments. The line edge roughness may be about 3 nm or less. In some embodiments, the integrated circuit may further comprise a phase change material disposed in the channel and extending between the conductive line and the upper electrode. The conductive line may comprise a resistive heater. The resistive heater may include a material chosen from the group consisting of W, Ni, Pt, TiN, TiW, TaN, and NbN. In some embodiments, the cross-section may be substantially in the shape of a square.

In other embodiments, an integrated circuit includes a memory cell. The memory cell has a bottom electrode; an upper electrode; and a conductive wire extending vertically between the bottom and upper electrode. The conductive wire is disposed within a discrete, laterally elongated insulating region. The conductive wire extends across an entire width of the insulating region.

In some embodiments, a cross-section of the insulating region may have a parallelogram shape as seen in a top down view. In some embodiments, the conductive wire may be at least partly formed of phase change material.

In yet other embodiments, a memory device includes a memory cell. The memory cell includes a lower electrode; a vertically-extending lower conductive plate above and electrically connected to the lower electrode; a vertically-extending conductive wire above and electrically connected to the lower conductive plate; a vertically-extending upper conductive plate above and electrically connected to the wire; and an upper electrode above and electrically connected to the vertically-extending second conductive plate. The upper and lower conductive plates are elongated into crossing directions. In some embodiments, the conductive wire may comprise a phase change material.

Accordingly, although certain embodiments are described herein, other embodiments that are apparent to those of ordinary skill in the art, including embodiments that do not provide all of the features and/or advantages set forth herein, are also encompassed by this invention. Accordingly, the scope of the present invention is defined only by reference to the appended claims.

What is claimed is:

1. An integrated circuit, comprising:
  a memory cell, comprising:
    a bottom electrode;
    an upper electrode;
    a conductive line and a spacer layer, in a channel formed between a first portion of a dielectric material and a second portion of the dielectric material in contact with and positioned between the bottom electrode and the upper electrode, the conductive line formed above the spacer layer, the spacer layer contacting the bottom electrode, the channel extending vertically between the bottom electrode and the upper electrode and between the first portion and the second portion, the channel formed between the first portion of the dielectric material and the second portion of the dielectric material being further formed between a first portion of a filler material and a second portion of the filler material, wherein the filler material is formed above the dielectric material, the conductive line having a cross-section substantially in a shape of a parallelogram.

2. The integrated circuit of claim 1, wherein a width of the conductive line is based at least in part on a width of a spacer volume.

3. The integrated circuit of claim 2, wherein the spacer volume comprises a first material deposited on a first level in contact with the spacer volume and a second material deposited on a second level in contact with the spacer volume.

4. The integrated circuit of claim 3, wherein the width of the spacer volume is based at least in part on a dimension of the first level and a dimension of the second level.

5. The integrated circuit of claim 4, wherein the width of the spacer volume comprises a width of the first level and a width of the second level.

6. The integrated circuit of claim 1, wherein each side of the parallelogram comprises a length of about 40 nm or less.

7. The integrated circuit of claim 1, wherein a length of the conductive line is about 25 nm or less.

8. The integrated circuit of claim 1, wherein the conductive line comprises a line edge roughness of about 3 nm or less.

9. The integrated circuit of claim 1, further comprising:
a phase change material disposed in the channel and extending between the conductive line and the upper electrode.

10. The integrated circuit of claim 9, wherein the conductive line comprises a resistive heater.

11. The integrated circuit of claim 10, wherein the resistive heater comprises a material chosen from the group consisting of W, Ni, Pt, TiN, TiW, TaN, TaSiN, TiSiN, and NbN.

12. The integrated circuit of claim 1, wherein the cross-section is substantially in the shape of a square.

13. A memory cell, comprising:
a lower electrode;
a vertically-extending lower conductive plate above and electrically connected to the lower electrode;
a vertically-extending conductive wire and a spacer layer disposed within a channel and extending across a length and a width of the channel, the vertically-extending conductive wire being above and electrically connected to the lower conductive plate, the channel formed between a first portion of a dielectric material and a second portion of the dielectric material in contact with and positioned between the lower electrode and an upper electrode, the channel is further formed between a first portion of a filler material and a second portion of the filler material, wherein the filler material is formed above the dielectric material;
a vertically-extending upper conductive plate above and electrically connected to the vertically-extending conductive wire; and
the upper electrode above and electrically connected to the vertically-extending upper conductive plate, the upper and lower conductive plates elongated into crossing directions,
the vertically-extending conductive wire extending, from a point of intersection associated with the crossing directions, in a direction different from the crossing directions.

14. The memory cell of claim 13, wherein the vertically-extending conductive wire comprises a phase change material.

* * * * *